(12) United States Patent
Wei et al.

(10) Patent No.: US 11,251,345 B2
(45) Date of Patent: Feb. 15, 2022

(54) LIGHT CONVERSION SUBSTRATE AND MANUFACTURING METHOD THEREOF, AND DISPLAY PANEL

(71) Applicant: CHENGDU VISTAR OPTOELECTRONICS CO., LTD., Sichuan (CN)

(72) Inventors: Dong Wei, Kunshan Suzhou (CN); Xiaolong Yang, Kunshan Suzhou (CN); Jiantai Wang, Kunshan Suzhou (CN); Huashan Chen, Kunshan Suzhou (CN); Rubo Xing, Kunshan Suzhou (CN)

(73) Assignee: CHENGDU VISTAR OPTOELECTRONICS CO., LTD., Chengdu (CN)

( * ) Notice: Subject to any disclaimer, the term of this patent is extended or adjusted under 35 U.S.C. 154(b) by 101 days.

(21) Appl. No.: 16/808,648

(22) Filed: Mar. 4, 2020

(65) Prior Publication Data
US 2020/0203584 A1 Jun. 25, 2020

Related U.S. Application Data

(63) Continuation of application No. PCT/CN2019/084867, filed on Apr. 28, 2019.

(30) Foreign Application Priority Data

Aug. 31, 2018 (CN) .......................... 201811012029.6

(51) Int. Cl.
*H01L 33/54* (2010.01)
*H01L 25/075* (2006.01)
(Continued)

(52) U.S. Cl.
CPC .......... *H01L 33/54* (2013.01); *H01L 25/0753* (2013.01); *H01L 33/06* (2013.01); *H01L 33/504* (2013.01); *H01L 2933/005* (2013.01)

(58) Field of Classification Search
CPC ..... H01L 33/54; H01L 25/0753; H01L 33/06; H01L 33/504; H01L 2933/005
See application file for complete search history.

(56) References Cited

U.S. PATENT DOCUMENTS

| | | | |
|---|---|---|---|
| 9,653,041 B2 | 5/2017 | Nakanishi et al. | |
| 2018/0003870 A1* | 1/2018 | Wu | G02B 5/22 |
| 2018/0005998 A1 | 1/2018 | Ulmer | |

FOREIGN PATENT DOCUMENTS

| | | |
|---|---|---|
| CN | 103471011 A | 12/2013 |
| CN | 104377226 A | 2/2015 |

(Continued)

OTHER PUBLICATIONS

Chinese First Office Action for Application No. 201811012029.6 dated Jul. 16, 2020.

(Continued)

*Primary Examiner* — Eliseo Ramos Feliciano
*Assistant Examiner* — Mikka Liu
(74) *Attorney, Agent, or Firm* — Maier & Maier, PLLC

(57) ABSTRACT

The present disclosure provides a light conversion substrate and a manufacturing method thereof, and a display panel. The light conversion substrate may include a substrate having a first surface and a second surface arranged opposite to each other. A plurality of first grooves may be defined on the first surface of the substrate. A plurality of second grooves may be defined on the second surface of the substrate. The plurality of first grooves and the plurality of second grooves are arranged alternately. A first light conversion body may be arranged in each of the plurality of first grooves. A second light conversion body ma be arranged in each of the plurality of second grooves. In the present disclosure, light conversion materials may not interfere with each other during the manufacturing method, so that the (Continued)

present disclosure may be suitable for a display panel with high pixel density.

17 Claims, 6 Drawing Sheets

(51) Int. Cl.
*H01L 33/06* (2010.01)
*H01L 33/50* (2010.01)

(56) References Cited

FOREIGN PATENT DOCUMENTS

| | | | |
|---|---|---|---|
| CN | 104813223 | A | 7/2015 |
| CN | 105526558 | A | 4/2016 |
| CN | 105529346 | A | 4/2016 |
| CN | 105565264 | A | 5/2016 |
| CN | 103337496 | B | 6/2016 |
| CN | 106054449 | A | 10/2016 |
| CN | 106611826 | A | 5/2017 |
| CN | 206684429 | U | 11/2017 |
| CN | 107634082 | A | 1/2018 |

OTHER PUBLICATIONS

Office Action dated May 8, 2021 in corresponding Chinese Application No. 201811012029.6; 16 pages including English-language translation.

International Search Report for Application No. PCT/CN2019/084867 dated Jul. 29, 2019.

\* cited by examiner

LIGHT CONVERSION SUBSTRATE AND MANUFACTURING METHOD THEREOF, AND DISPLAY PANEL

CROSS-REFERENCE TO RELATED APPLICATIONS

The present application is a continuation-application of International (PCT) Patent Application No. PCT/CN2019/084867, filed on Apr. 28, 2019, which claims foreign priority or Chinese Patent Application No. 201811012029.6, filed on Aug. 31, 2018 in the China National Intellectual Property Administration, the entire contents of which are hereby incorporated by reference.

FIELD

The described embodiments relate to a display technology, and more particularly, to a light conversion substrate and a manufacturing method thereof, and a display panel.

BACKGROUND

With the development of display technology, a basic feature of the current display panel is color displaying. In order to realize the color displaying, three-color light RGB is generally required. In a field of display technology, a three-color light source can direct emit three-color light, or a single-color light source can be used in combination with a light conversion substrate to emit three-color light. The light conversion substrate can convert light of a certain color into other colors light, to achieve the three-color light generation.

However, in the manufacturing process of existing light conversion substrates, the manufacturing process of different light conversion bodies on the substrate are likely to affect each other, and thus the interval between different light conversion bodies cannot be too small. Therefore, the existing light conversion substrates are not suitable for a display panel with high pixel density.

SUMMARY

The present disclosure provides a light conversion substrate and a manufacturing method thereof, and a display panel, to solve a problem that the different light conversion bodies in the light conversion substrate easily interfere with each other.

In order to solve the above-mentioned technical problem, a technical solution adopted by the present disclosure is to provide a substrate having a first surface and a second surface arranged opposite to each other; wherein a plurality of first grooves is defined on the first surface of the substrate, and a plurality of second grooves is defined on the second surface of the substrate; the plurality of first grooves and the plurality of second grooves are arranged alternately; a first light conversion body is arranged in each of the plurality of first grooves; and a second light conversion body is arranged in each of the plurality of second grooves.

In order to solve the above-mentioned technical problem, a technical solution adopted by the present disclosure is to provide a display panel including a light emitting substrate and a light conversion substrate; wherein the light emitting substrate is arranged on a side of the light conversion substrate, and the light conversion substrate includes a substrate having a first surface and a second surface arranged opposite to each other; wherein a plurality of first grooves is defined on the first surface of the substrate, and a plurality of second grooves is defined on the second surface of the substrate; the plurality of first grooves and the plurality of second grooves are arranged alternately; a first light conversion body is arranged in each of the plurality of first grooves; and a second light conversion body is arranged in each of the plurality of second grooves.

In order to solve the above-mentioned technical problem, a technical solution adopted by the present disclosure is to provide a manufacturing method of a light conversion substrate including: providing a substrate having a first surface and a second surface arranged opposite to each other; processing the first surface of the substrate to form a plurality of first grooves; processing the second surface of the substrate to form a plurality of second grooves; wherein the plurality of first grooves and the plurality of second grooves are arranged alternately; filling a first light conversion body in each of the plurality of first grooves; sealing a first sealing layer on the first surface of the substrate to seal the first light conversion body in the each of the plurality of first grooves; filling a second light conversion body in each of the plurality of second grooves; sealing a second sealing layer on the second surface of the substrate to seal the second light conversion body in the each of the plurality of second grooves.

The light conversion substrate provided by the present disclosure, includes a substrate having a first surface and a second surface arranged opposite to each other; wherein a plurality of first grooves is defined on the first surface of the substrate, and a plurality of second grooves is defined on the second surface of the substrate; the plurality of first grooves and the plurality of second grooves are arranged alternately; a first light conversion body is arranged in each of the plurality of first grooves; and a second light conversion body is arranged in each of the plurality of second grooves. In the present disclosure, the first light conversion body and second light conversion body are respectively arranged on the first surface and second surface in the light conversion substrate, so that the manufacturing process of the first light conversion body and second light conversion body may not interfere with each other. A distance between the plurality of first grooves and the plurality of second grooves may be minimized, to be suitable for high pixel density display panels.

DETAILED DESCRIPTION

In order to enable those skilled in the art to better understand the technical solutions in the present disclosure, a light conversion substrate and a manufacturing method thereof, and a display panel provided by the present disclosure are further described in detail below with reference to the accompanying drawings and specific embodiments.

Figure 1:
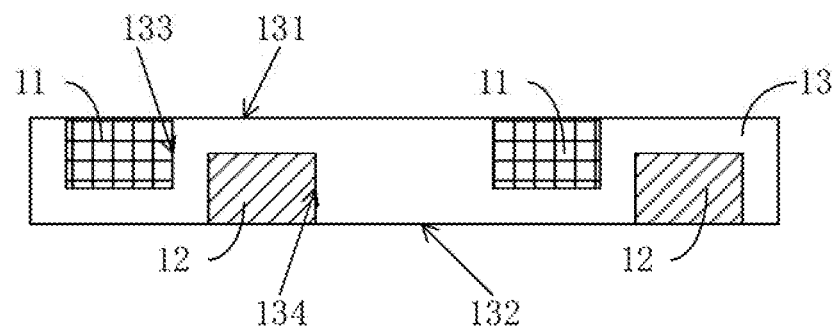
FIG. 1 is a structure illustration of a light conversion substrate in accordance with an embodiment in the present disclosure.

Referring to FIG. 1, FIG. 1 is a structure illustration of a light conversion substrate in accordance with an embodiment in the present disclosure. In this embodiment, a light conversion substrate 100 may include a first light conversion body 11, a second light conversion body 12, and a substrate 13.

The first light conversion body 11 and the second light conversion body 12 may be both arranged on the substrate 13. Light may be incident on the light conversion body through the substrate 13, or the light conversion body may emit light through the substrate 13. Therefore, in the embodiment, the substrate 13 may be a transparent substrate. A material of the substrate 13 may be inorganic glass, polymethyl methacrylate (PMMA), polyethylene terephthalate (PET), or polyimide (PI).

In this embodiment, the substrate 13 may be a flat plate structure. The substrate 13 may include a first surface 131 and a second surface 132 arranged opposite to each other. A plurality of first grooves 133 may be defined on the first surface 131. A plurality of second grooves 134 may be defined on the second surface 132. The first light conversion body 11 may be arranged in each of the plurality of first grooves 133, and the second light co aversion body 12 may be arranged in each of the plurality of second grooves 134.

The first light conversion body 11 in each of the plurality of first grooves 133 may be configured to convert a first color light. The second light conversion body 12 in each of the plurality of second grooves 134 may be configured to convert a second color light. The first light conversion body and second light conversion body may include one or more light conversion materials. The light conversion material may be a fluorescent material or a quantum dot. For fluorescent materials, the fluorescent materials absorb energy of an excitation light source, to cause energy level transitions to emit light. Fluorescent of different materials excites light of different colors. For quantum dots, i.e., particles with a nanometer-scale size, the quantum dots are possible to emit light under an excitation light source, based on their own quantum effects. The quantum dots with different sizes excite light of different colors.

The first light conversion body 11 in each of the plurality of first grooves 133 on the substrate may serve as a light source of the first color light. The second light conversion body 12 in each of the plurality of second grooves 134 may serve as a light source of the second color light. Thus, the plurality of first grooves 133 and the plurality of second grooves 134 may be arranged alternately to prevent the two colors of light from interfering with each other. The plurality of first grooves 133 and the plurality of second grooves 134 may be respectively arranged on both surfaces of the substrate, so that the light conversion materials in each of the plurality of first grooves 133 and each of the plurality of second grooves 134 may not interfere with each other.

In this embodiment, the first light conversion body 31 in each of the plurality of first grooves 133 may serve as the light source of the first color light. When the first light conversion body 11 is applied to a display panel, the first light conversion body 11 in each of the plurality of first grooves 133 may correspond to a light source as a first color pixel. When the first light conversion body 11 is applied to a display panel that is self-illuminating for each pixel, one of grooves may correspond to one pixel. Since the plurality of first grooves 133 and the plurality of second grooves 134 are respectively arranged on both surfaces of the substrate, the light conversion materials in each of the plurality of first grooves 133 and each of the plurality of second grooves 134 may not interfere with each other. Therefore, distance between one of the plurality of first grooves 133 and one of the plurality of second grooves 134 may be as short as possible, i.e., it may be suitable for a display panel with high pixel density.

Further, in this embodiment, the light conversion substrate 100 may further include a first sealing layer 14 and a second sealing layer 15 configured to seal the first light conversion body and the second light conversion body. Specifically, the first sealing layer 14 may be arranged in at least one of the plurality of first grooves 133 or on the plurality of first grooves 133 to seal the first light conversion body 11 in the at least one of the plurality of first grooves 133, and the second sealing layer 15 may be arranged in at least one of the plurality of second grooves 134 or on the plurality of second grooves 134 to seal the second light conversion body 12 in the at least one of the plurality of second grooves 134. A sealing layer may be made of resin materials. The first sealing layer 14 and the second sealing layer 15 may be made of a same resin material, or different resin materials. For example, the sealing layer may be made of one or more of epoxy resin, acrylic resin, silicone rubber, an UV glue, and the like.

Figure 2:
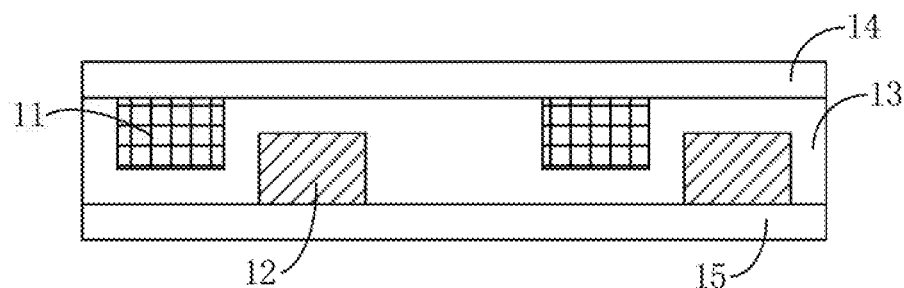
FIG. 2 is a structure illustration of a sealing layer in accordance with an embodiment of a light conversion substrate shown in FIG. 1 in the present disclosure.
Figure 3:
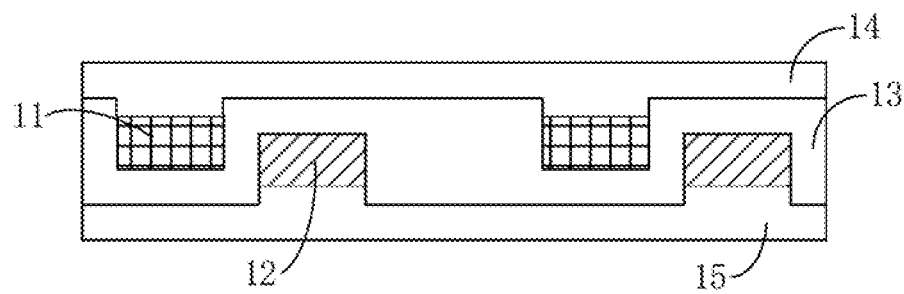
FIG. 3 is a structure illustration of a sealing layer in accordance with another embodiment of a light conversion substrate shown in FIG. 1 in the present disclosure.
Figure 4:
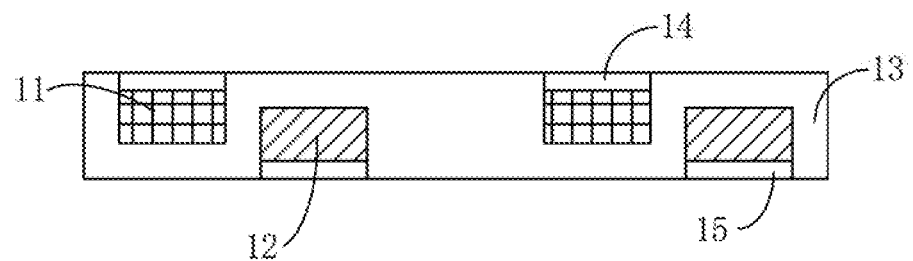
FIG. 4 is a structure illustration of a sealing layer in accordance with more another embodiment of a light conversion substrate shown in FIG. 1 in the present disclosure.

Referring to FIGS. 2 to 4, specific structures of the sealing layer are described. FIG. 2 is a structure illustration of a sealing layer in accordance with an embodiment of a light conversion substrate shown in FIG. 1 in the present disclosure. FIG. 3 is a structure illustration of a sealing layer in accordance with another embodiment of a light conversion substrate shown in FIG. 1 in the present disclosure. FIG. 4 is a structure illustration of a sealing layer in accordance with more another embodiment of a light conversion substrate shown in FIG. 1 in the present disclosure.

In the case shown in FIG. 2, the first light conversion body 11 may be filled in each of the plurality of first grooves 133, and the first sealing layer 14 may be arranged on the plurality of first grooves 133 to cover the first surface 131 of the substrate 13. The second light conversion body 12 may be filled in each of the plurality of second grooves 134, and the second sealing layer 15 may be arranged on the plurality of second grooves 134 to cover the second surface 132 of the substrate 13.

In the case shown in FIG. 3, the first sealing layer 14 may be arranged in each of the plurality of first grooves 133 to seal the first light conversion body 11 in the each of the plurality of first grooves 133. The second sealing layer 15 may be arranged in each of the plurality of second grooves 134 to seal the second light conversion body 12 in the each of the plurality of second grooves 134.

In the case shown in FIG. 4, the first sealing layer 14 may be arranged in at least one of the plurality of first grooves 133 to seal the first light conversion body 11 in the at least one of the plurality of first grooves 133, and a surface of the first sealing layer 14 away from the first light conversion body 11 may be aligned with the first surface 131 of the substrate 13. The second sealing layer 15 may be arranged in al least one of the plurality of second grooves 134 to seal the second light conversion body 12 in the at least one of the plurality of second grooves 134, and a surface of the second sealing layer 15 away from the second light conversion body 12 may be aligned with the second surface 132 of the substrate 13.

Arrangements of the sealing layer may be not only limited to the above-mentioned three cases, but also to be a combination of the above-mentioned three cases. For example, the first light conversion body 11 may be filled in each of the plurality of first grooves 133, and the first sealing layer 14 may cover the first surface 131 of the substrate 13; the second sealing layer 15 may be arranged in at least one of the plurality of second grooves 134 to seal the second light conversion body 12 in the at least one of the plurality of second grooves 134, and the surface of the second sealing layer 15 away from the second light conversion body 12 may be aligned with the second surface 132 of the substrate 13. No additional description about other cases is given herein.

For the above-mentioned three cases shown in FIGS. 2 to 4, in the case shown in FIG. 2 compared with the other two cases, light conversion materials may be used more in the light conversion substrate than the other two cases, so that light emitting efficiency may be higher. In the case shown in FIG. 3 compared with the other two cases, the manufacturing process of the light conversion substrate may be simpler. In the case shown in FIG. 2, the process of filling a plurality of grooves is more complicated than the process of filling only a part of a plurality of grooves. In the case shown in FIG. 4, a thinning process is further required to make the sealing layer aligned with the surface of the substrate, after the sealing layer is formed. In the case shown in FIG. 4 compared with the other two cases, the structure of the light conversion substrate may be lighter and thinner than the other two cases.

The light conversion substrate of the above-mentioned embodiments may be applied to a display panel, to implement the color displaying as a color light source. Further, based on the above-mentioned embodiments, in the light conversion substrate provided in the present disclosure, a plurality of pixel regions arranged in an array may be defined on the substrate, i.e., the plurality of pixel regions may correspond to a plurality of pixels of a display panel. Each of the plurality of first grooves and each of the plurality of second grooves respectively may be arranged corresponding to one of the plurality of pixel regions, i.e., each of grooves may correspond to a pixel. The light conversion body in each of the grooves may emit light to realize self-emission of each of the plurality of pixels in the display panel. Various arrangements of color pixels in a display panel may all adopt the light conversion substrate in the present disclosure. For example, several embodiments of light conversion substrates are shown in FIGS. 5 to 8. The structures of the light conversion substrate of the embodiments shown in FIGS. 5 to 8 are similar to the structure of the light conversion substrate 100 of the above-mentioned embodiments, therefore no additional description is given herein.

Figure 5:
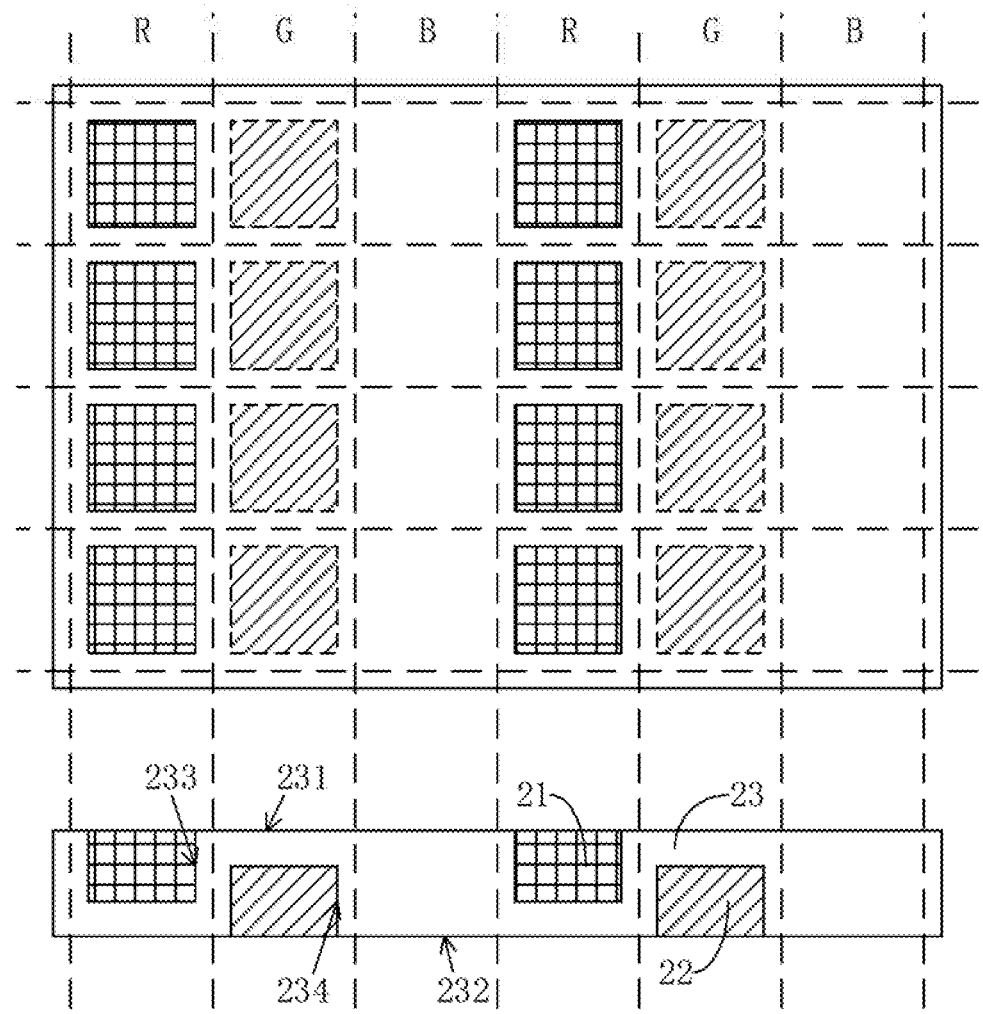
FIG. 5 is a structure illustration of a light conversion substrate in accordance with an embodiment in the present disclosure.

Referring to FIG. 5, FIG. 5 is a structure illustration of a light conversion substrate in accordance with an embodiment in the present disclosure. In this embodiment, a plurality of pixel regions defined on a substrate 23 of the light conversion substrate 200, may include a red pixel region R, a green pixel region G, and a blue pixel region B arranged periodically. A display panel corresponding to this embodiment may adopt a traditional RGB arrangement.

Each of the plurality of first grooves 233 may be arranged corresponding to the red pixel region. The first light conversion body 21 may be a red light quantum dot. Each of the plurality of second grooves 234 may be arranged corresponding to the green pixel region. The second light conversion body 22 may be a green light quantum dot. FIG. 5 illustrates a top view of the first surface 231, and the plurality of second grooves 234 of the second surface 232 is indicated by a dotted line.

In this embodiment, a blue light source may be adopted to excite red light quantum dots and green light quantum dots to produce red light and green light. For the blue pixel region B, a portion of the substrate may be a flat structure. Light emitted from the blue light source may be directly emitted through the substrate which is transparent.

Figure 6:
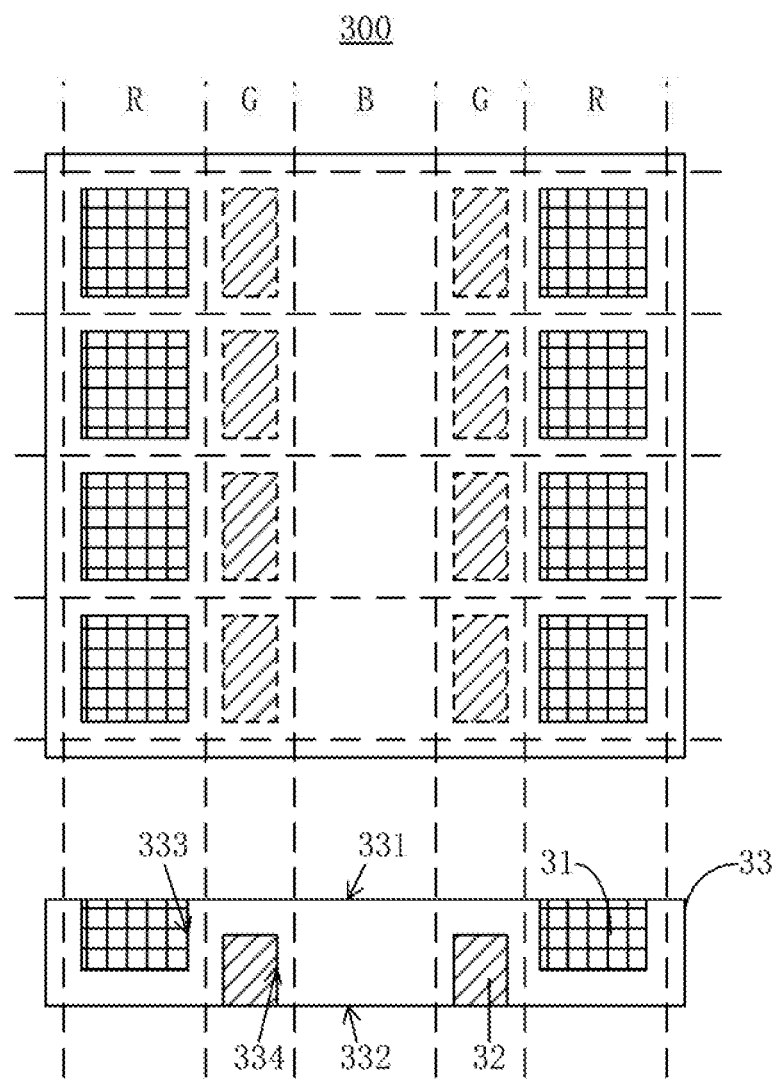
FIG. 6 is a structure illustration of a light conversion substrate in accordance with an embodiment in the present disclosure.

Referring to FIG. 6, FIG. 6 is a structure illustration of a light conversion substrate in accordance with an embodiment in the present disclosure. In this embodiment, a plurality of pixel regions defined on a substrate 33 of the light conversion substrate 300, may include a red pixel region R, a first green pixel region G, a blue pixel region B, and a second green pixel region G arranged periodically. Red and blue pixels in a display panel corresponding to this embodiment may be common pixels, i.e., the PenTiel matrix is adopted. Widths of the red pixel region R and blue pixel region B in the display panel corresponding to this embodiment, may be larger than a width of the first green pixel region G and a width of the second green pixel region G. The widths of the red pixel region R and blue pixel region B may be generally set double than the width of the first green pixel region G and the width of the second green pixel region G.

Each of the plurality of first grooves 333 may be arranged corresponding to the red pixel region. The first light conversion body 31 may be a red light quantum dot. Each of the plurality of second grooves 334 may be arranged corresponding to the first and second green pixel regions. The second light conversion body 32 may be a green light quantum dot.

FIG. 6 also illustrates a top view of the first surface 331, and the plurality of second grooves 334 of the second surface 332 is indicated by a dotted line. A blue light source may be adopted. For the blue pixel region B, at portion of the substrate may be a flat structure.

Figure 7:
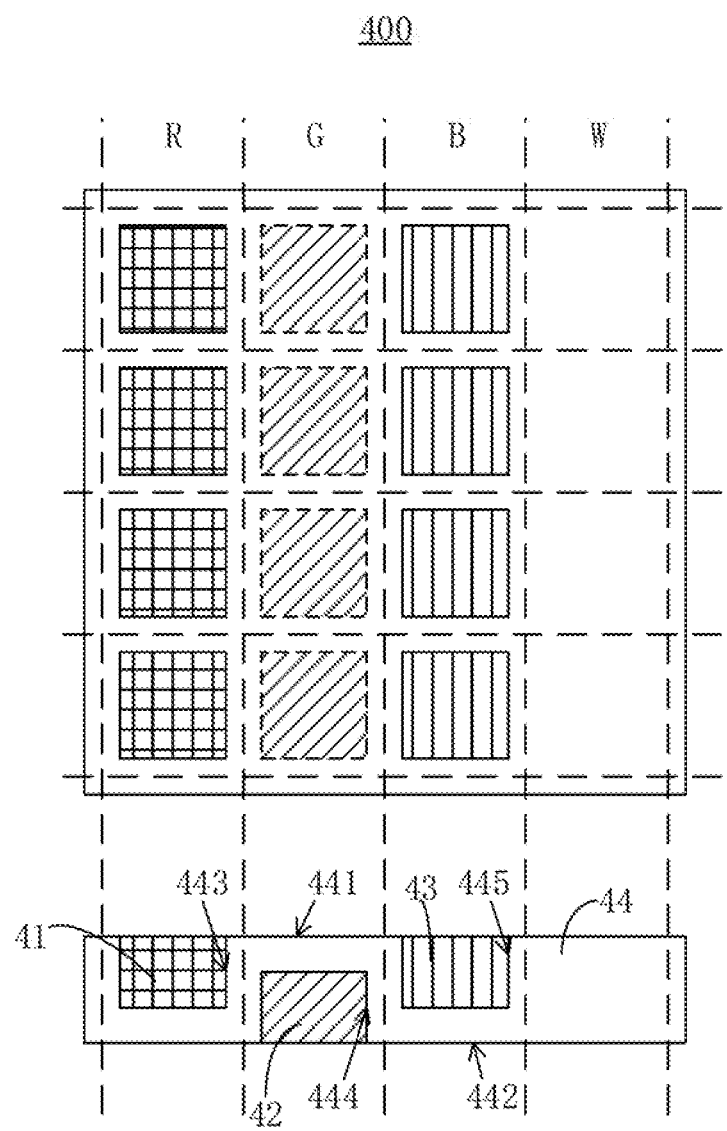
FIG. 7 is a structure illustration of a light conversion substrate in accordance with an embodiment in the present disclosure.

Referring to FIG. 7, FIG. 7 is a structure illustration of a light conversion substrate, in accordance with an embodiment in the present disclosure. In this embodiment, the light conversion substrate 400 may include a first light conversion body 41, a second light conversion body 42, a third light conversion body 43, and a substrate 44.

The substrate 44 may include a first surface 441 and a second surface 442. A plurality of first grooves 443 and a plurality of third grooves 445 may be defined on the first surface 441. A plurality of second grooves 444 may be defined on the second surface 442.

The first light conversion body 41 may be arranged in each of the plurality of first grooves 443. The second light conversion body 42 may be arranged in each of the plurality of second grooves 444. The third light conversion body 43 may be arranged in each of the plurality of third grooves 445.

A plurality of pixel regions may be defined on the substrate 44. Each of the plurality of first grooves 443, each of the plurality of second grooves 444, and each of the plurality of third grooves 445 may be corresponding to one of the plurality of pixel regions. At least one of the plurality of pixel regions may be located between one of the plurality of first grooves 443 and adjacent one of the plurality of third grooves 445 arranged on the first surface 441.

In this embodiment, the light conversion substrate 400 may be applied to a display panel in RGBW arrangement. Specifically, the plurality of pixel regions may include a red pixel region R, a green pixel region G, a blue pixel region B, and a white pixel region W.

Each of the plurality of first grooves 443 may be arranged corresponding to the red pixel region R. The first light conversion body 41 may be a red light quantum dot. Each of the plurality of second grooves 444 may be arranged corresponding to the green pixel region G. The second light conversion body 42 may be a green light quantum dot. Each of the plurality of third grooves 445 may be arranged corresponding to the blue pixel region B. The third light conversion body 43 may be a blue light quantum dot. The light conversion substrate 400 may adopt a white light source, and a portion of the substrate 44 corresponding to the white pixel region W may be a flat structure.

Figure 8:
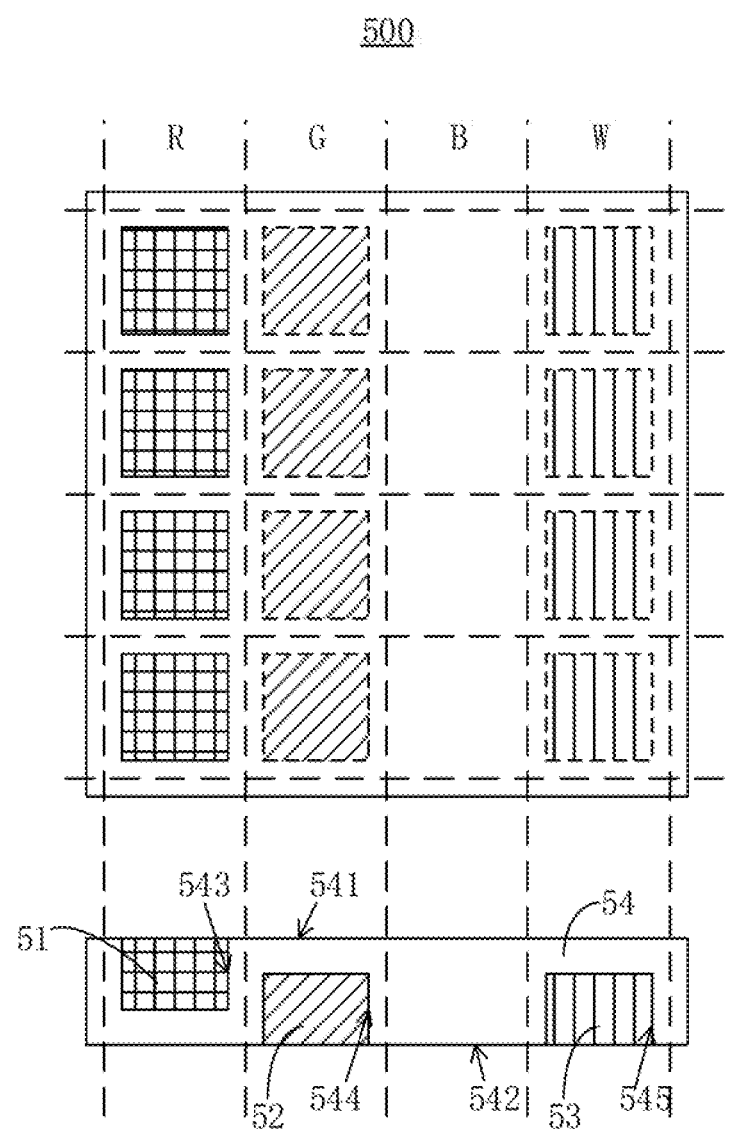
FIG. 8 is a structure illustration of a light conversion substrate in accordance with an embodiment in the present disclosure.

Referring to FIG. 8, FIG. 8 is a structure illustration of a light conversion substrate accordance with an embodiment in the present disclosure. In this embodiment, the light conversion substrate 500 is similar to the light conversion substrate 400 in the embodiment shown FIG. 7, and may also include a first light conversion body 51, a second light conversion body 52, a third light conversion body 53, and a substrate 54.

The substrate 54 may include a first surface 541 and a second surface 542. A plurality of first grooves 543 may be defined on the first surface 541. A plurality of second grooves 544 and a plurality of third grooves 545 may be defined on the second surface 542.

The first light conversion body 51 may be arranged in each of the plurality of first grooves 543. The second light conversion body 52 may be arranged in each of the plurality of second grooves 544. The third light conversion body 53 may be arranged in each of the plurality of third grooves 545.

A plurality of pixel regions may be defined on the substrate 54. Each of the plurality of first grooves 543, each of the plurality of second grooves 544, and each of the plurality of third grooves 545 may be corresponding to one of the plurality of pixel regions. At least one of the plurality of pixel regions may be located one of the plurality of second grooves 544 and adjacent one of the plurality of third grooves 545 arranged on the second surface 542.

In this embodiment, the light conversion substrate 500 may also be applied to a display panel in an RGBW arrangement. Specifically, the plurality of pixel regions may include a red pixel region R, a green pixel region G, a blue pixel region B, and a white pixel region W.

Each of the plurality of first grooves 543 may be arranged corresponding to the red pixel region R. The first light conversion body 51 may be a red light quantum dot. Each of the plurality of second grooves 544 may be arranged corresponding to the green pixel region G. The second light conversion body 52 may be a green light quantum dot. Each of the plurality of third grooves 545 may be arranged corresponding to the white pixel region W. The third light conversion body 53 may be a mixture of red light quantum dots and green light quantum dots. The light conversion substrate 500 may adopt a blue light source, and a portion of the substrate 54 corresponding to the blue pixel region B may be a flat structure.

In the above-mentioned embodiments shown in FIGS. 5 to 8, the light conversion materials adopted by the light conversion body may be all quantum dots. In other embodiments, other light conversion materials such as a fluorescent material may also be adopted, and the corresponding light source may also be an ultraviolet light source.

Figure 9:
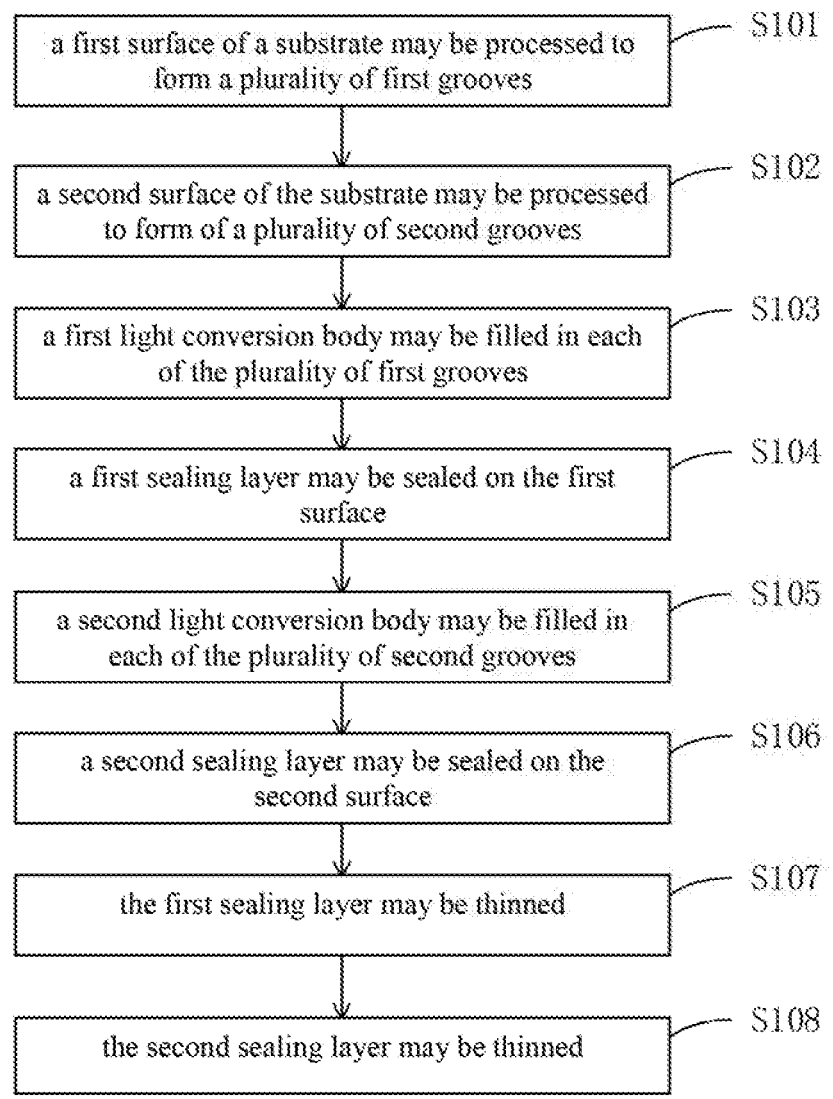
FIG. 9 is a flow chart of a manufacturing method of a light conversion substrate in accordance with an embodiment in the present disclosure.

A manufacturing process of the light conversion substrate provided in the present disclosure may be referred to FIG. 9. FIG. 9 is a flow chart of a manufacturing method of a light conversion substrate in accordance with an embodiment in the present disclosure. This manufacturing method may include the following operations.

Block S101, a first surface of a substrate may be processed to form a plurality of first grooves.

Block S102, a second surface of the substrate may be processed to form of a plurality of second grooves.

In this manufacturing process, the above-mentioned block S101 and block S102 may be performed in sequence. The first surface may be processed to obtain the plurality of first grooves, and then the second surface may be processed to obtain the plurality of second grooves. The first surface and the second surface may be arranged opposite to each other. The plurality of first grooves and the plurality of second grooves may be arranged alternately.

In addition, for the embodiment in which each of the plurality of grooves corresponds to one of a plurality of pixel regions, when the plurality of grooves is processed to be obtained, an accurate alignment operation ma need to be performed, so as to ensure that the plurality of grooves may accurately correspond to the plurality of pixels when a display panel is assembled and formed.

When the above-mentioned process adopts a photolithography process to form the plurality of grooves, a set of matching masks may be used to achieve the accurate alignment. According to a pixel size of a display panel, a first mask suitable for the lint surface and a second mask suitable for the second surface may be manufactured, and then the masks may be processed to obtain the plurality of grooves. The two masks may be manufactured based on a same pixel size and have a same standard, so that the accurate alignment of the plurality of first grooves and the plurality of second grooves may be achieved.

Block S103, a first light conversion body may be filled in each of the plurality of first grooves.

Block S104, a first sealing layer may be sealed on the first surface of the substrate.

Block S104, a second light conversion body may be filled in each of the plurality of second grooves.

Block S106, a second sealing layer may be sealed on the second surface of the substrate.

In this embodiment, the above-mentioned block S103 to block S106 may be performed in sequence. After the first light conversion body is filled in each of the plurality of first grooves, the plurality of first grooves may be sealed. Then, the second light conversion body may be filled in each of the plurality of second grooves, and then the plurality of second grooves may be sealed. The filling process of the first light conversion body and the second light conversion body may be performed by printing, blade coating, or photolithography.

In the case shown in FIG. 4, after blocks S103 to S106 are completed, blocks S107 to S108 may need to be further performed.

Block S107, the first sealing layer may be thinned.

Block S108, the second sealing layer may be thinned.

The first sealing layer and the second sealing layer may be respectively performed to a thinning treatment, so that the first sealing layer may be aligned with an opening top of each of the plurality of first grooves, and the second sealing layer may be aligned with an opening top of each of the plurality of second grooves. After the thinning process is performed on the first sealing layer in block S107, the obtained light conversion substrate may be generally thin, so before block S108, light conversion substrate may be bound to a support substrate to facilitate the thinning treatment in block S108. In block S107, a surface preformed the thinning process may be a binding surface which is bound.

The thinning treatment may be performed bye a chemical mechanical polishing (CMP) process, a reactive ion etching (RIE) process, and an inductivity coupled plasma g (ICP) process.

In the above-mentioned manufacturing process, the formation of the first light conversion body and the second light conversion body may not interfere with each other, so that the plurality of first grooves and the plurality of second grooves may be processed as close as possible, and the obtained light conversion substrate may be applied to a display panel with high pixel density.

The above-mentioned light conversion substrate may be applied to a Micro-LED, OLED, quantum dot display panel, and the like. Take a Micro-LED display panel as an example, a plurality of grooves corresponds to a plurality of pixels, so that the plurality of grooves may be set as cubes. Each of groove opening corresponding to one of plurality of grooves may be a rectangle shape, and may have a side length in 1 μm to 100 μm, and a specific length may be 50 μm. Each of the plurality of grooves may also be a cylinder. Each of the groove opening corresponding to one of Omni ty of grooves may be a circular shape, and may have a diameter in 1 μm to 100 μm, and a specific diameter may be 50 μm.

Figure 10:
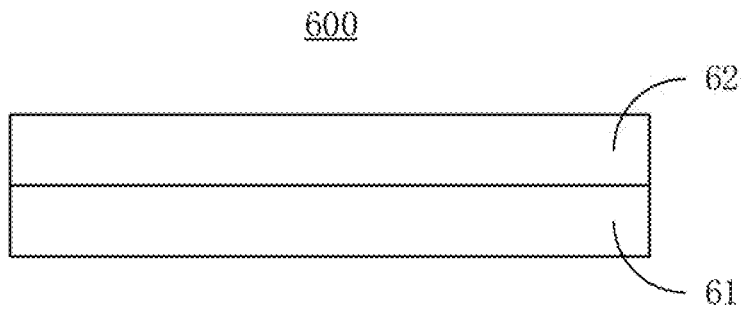
FIG. 10 is a structure illustration of a display panel in accordance with an embodiment in the present disclosure.

The present disclosure provides a display panel including the above-mentioned light conversion substrate. For details, referring to FIG. 10, FIG. 10 is a structure illustration of a display panel in accordance with an embodiment in the present disclosure.

In this embodiment, the display panel 600 may include a light emitting substrate 61 and a light conversion substrate 62. The light emitting substrate 61 may be arranged on a side of the light conversion substrate 62. In order to ensure a light utilization rate, the light emitting substrate 61 may be attached to the light conversion substrate 62.

The light emitting substrate 61 may be an ultraviolet light emitting substrate, a white light emitting substrate, and a blue light emitting substrate. Take the blue light emitting substrate as an example, the blue light emitting substrate may include an array of blue light LEDs, and light emitted from the blue light LEDs may directly enter the light conversion substrate 62. The blue light emitting substrate may also include a light guide plate and a blue light LED arranged on a side of the light guide plate. Light emitted from the blue light LED may enter the light conversion substrate 62 through the light guide plate.

In this embodiment, the display panel 600 may achieve high pixel density, and then achieve high-quality color expression.

It is understood that the descriptions above are only embodiments of the present disclosure. It is not intended to limit the scope of the present disclosure. Any equivalent transformation in structure and/or in scheme referring to the instruction and the accompanying drawings of the present disclosure, and direct or indirect application in other related technical field, are included within the scope of the present disclosure.

What is claimed is:

1. A light conversion substrate, comprising:
a substrate having a first surface and a second surface arranged opposite to each other, a plurality of first grooves defined on the first surface of the substrate, and a plurality of second grooves defined on the second surface of the substrate; the plurality of first grooves and the plurality of second grooves being arranged alternately;
a first light conversion body arranged in each of the plurality of first grooves;
a second light conversion body arranged in each of the plurality of second grooves;
a first sealing layer arranged in at least one of the plurality of first grooves to seal the first light conversion body in the at least one of the plurality of first grooves; and
a second sealing layer arranged in at least one of the plurality of second grooves to seal the second light conversion body in the at least one of the plurality of second grooves,
wherein a surface of the first sealing layer away from the first light conversion body is aligned with the first surface of the substrate; and/or a surface of the second sealing layer away from the second light conversion body is aligned with the second surface of the substrate.

2. The light conversion substrate according to claim 1, wherein a plurality of pixel regions arranged in an array is defined on the substrate; and each of the plurality of first grooves and each of the plurality of second grooves respectively correspond to one of the plurality of pixel regions.

3. The light conversion substrate according to claim 2, wherein
the plurality of pixel regions comprises a red pixel region, a green pixel region, and a blue pixel region arranged periodically;
each of the plurality of first grooves is arranged corresponding to the red pixel region, and the first light conversion body is a red light quantum dot, and each of the plurality of second grooves arranged corresponding to the green pixel region, and the second light conversion body is a green light quantum dot.

4. The light conversion substrate according to claim 3, wherein a portion of the substrate corresponding to the blue pixel region is a flat structure.

5. The light conversion substrate according to claim 2, wherein
the plurality of pixel regions comprises a red pixel region, a first green pixel region, a blue pixel region, and a second green pixel region arranged periodically;
each of the plurality of first grooves is arranged corresponding to the red pixel region, and the first light conversion body is a red light quantum dot; and each of the plurality of second grooves is arranged corresponding to the first and second green pixel regions, and the second, light conversion body is a green light quantum dot.

6. The light conversion substrate according to claim 5, wherein a portion of the substrate corresponding to the blue pixel region is a flat structure.

7. The light conversion substrate according to claim 2, wherein a plurality of third grooves is further defined on the first surface of the substrate; each of the plurality of third grooves is arranged corresponding to one of the plurality of pixel regions, at least one of the plurality of pixel regions is located between one of the plurality of first grooves and adjacent one of the plurality of third grooves; and the light conversion substrate further comprises a third light conversion body arranged in each of the plurality of third grooves.

8. The light conversion substrate according to claim 7, wherein the plurality of pixel regions comprises a red pixel region, a green pixel region, a blue pixel region, and a white pixel region arranged periodically;

each of the plurality of first grooves corresponds to the red pixel region, and the first light conversion body is a red light quantum dot; each of the plurality of second grooves corresponds to the green pixel region, and the second light conversion body is a green light quantum dot; and each of the plurality of third grooves corresponds to the blue pixel region, and the third light conversion body is a blue light quantum dot.

9. The light conversion substrate according to claim 8, wherein a portion of the substrate corresponding to the white pixel region is a flat structure.

10. The light conversion substrate according to claim 2, wherein a plurality of third grooves is further defined on the second surface of the substrate; each of the plurality of third grooves is arranged corresponding to one of the plurality of pixel regions; at least one of the plurality, of pixel regions is located between one of the plurality of first grooves and adjacent one of the plurality of third grooves; and the light conversion substrate further comprises a third light conversion body arranged in each of the plurality of third grooves.

11. The light conversion substrate according to claim 10, wherein the plurality of pixel regions comprises a red pixel region, a green pixel region, a blue pixel region, and a white pixel region arranged periodically;

each of the plurality of first grooves is arranged corresponding to the red pixel region, and the first light conversion body is a red light quantum dot; each of the plurality of second grooves arranged corresponding to the green pixel region, and the second light conversion body is a green light quantum dot; and each of the plurality of third grooves arranged corresponding to the white pixel region, and the third light conversion body is a mixture of a red light quantum, dot and a green, light quantum dot.

12. The light conversion substrate according to claim 11, wherein a portion of the substrate corresponding to the blue pixel region is a flat structure.

13. The light conversion substrate according to claim 1, wherein each of the plurality of first grooves and each of the plurality of second grooves are both a cube shape, each of groove openings corresponding to one of the plurality of first grooves and one of the plurality of second grooves is a rectangle shape, and a side length of the rectangle shape is 1 µm-100 µm; or each of the plurality of first grooves and each of the plurality of second grooves are a cylinder shape, each of the groove openings corresponding to one of the plurality of first grooves and one of the plurality of second grooves is a circular shape, and a diameter of the circular shape is 1 µm-100 µm.

14. The light conversion substrate according to claim 13, wherein the side length of the rectangle shape is 50 µm; or
the diameter of the circular shape is 50 µm.

15. A display panel comprising a light emitting substrate and a light conversion substrate wherein the light emitting substrate is arranged on a side of the light conversion substrate, and the light conversion substrate comprises:

a substrate having a first surface and a second surface arranged opposite to each other; a plurality of first grooves defined on the first surface of the substrate, and a plurality of second grooves defined on the second surface of the substrate; the plurality of first grooves and the plurality of second grooves being arranged alternately;

a first light conversion body arranged in each of the plurality of first grooves;

a second light conversion body arranged each of in the plurality of second grooves;

a first sealing layer arranged in at least one of the plurality of first grooves to seal the first light conversion body in the at least one of the plurality of first grooves; and a second sealing layer arranged in at least one of the plurality of second grooves to seal the second light conversion body in the at least one of the plurality of second grooves, wherein a surface of the first sealing layer away from the first light conversion body is aligned with the first surface of the substrate; and/or a surface of the second sealing layer away from the second light conversion body is aligned with the second surface of the substrate.

16. The display panel according to claim 15, wherein the light emitting substrate is selected from the group consisting of a blue light emitting substrate, an ultraviolet light emitting substrate, and a white light emitting substrate.

17. A manufacturing method of a light conversion substrate comprising:

providing a substrate having a first surface and a second surface arranged opposite to each other;

processing the first surface of the substrate to form a plurality of first grooves;

processing the second surface of the substrate to form a plurality of second grooves;

wherein the plurality of first grooves and the plurality of second grooves are arranged alternately;

filling a first light conversion body in each of the plurality of first grooves;

sealing first sealing layer on the first surface of the substrate to seal the first light conversion body in the each of the plurality of first grooves;

filling a second light conversion body in each of the plurality of second grooves;

sealing a second sealing layer on the second surface of the substrate to seal the second light conversion body in the each of the plurality of second grooves;

thinning the first sealing layer; and
thinning the second sealing layer.

* * * * *